United States Patent
Kitsunezuka et al.

(10) Patent No.: US 7,982,506 B2
(45) Date of Patent: Jul. 19, 2011

(54) VOLTAGE-CURRENT CONVERTER AND FILTER CIRCUIT USING SAME

(75) Inventors: Masaki Kitsunezuka, Tokyo (JP); Shinichi Hori, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 12/602,548

(22) PCT Filed: Jun. 4, 2008

(86) PCT No.: PCT/JP2008/060259
§ 371 (c)(1), (2), (4) Date: Dec. 1, 2009

(87) PCT Pub. No.: WO2008/149881
PCT Pub. Date: Dec. 11, 2008

(65) Prior Publication Data
US 2010/0176847 A1 Jul. 15, 2010

(30) Foreign Application Priority Data

Jun. 5, 2007 (JP) .................................. 2007-149221
Oct. 9, 2007 (JP) .................................. 2007-263193

(51) Int. Cl.
*H02M 11/00* (2006.01)
(52) U.S. Cl. ........................................ 327/103; 327/552
(58) Field of Classification Search .................. 327/103, 327/552
See application file for complete search history.

(56) References Cited

U.S. PATENT DOCUMENTS

| 5,767,708 A * | 6/1998 | Groeneveld et al. .......... 327/132 |
| 7,808,326 B2 * | 10/2010 | Sogawa et al. .................. 331/16 |
| 2009/0257531 A1 * | 10/2009 | Miyano et al. ................ 375/340 |

FOREIGN PATENT DOCUMENTS

| JP | 55-147816 A | 11/1980 |
| JP | 58-124310 A | 7/1983 |
| JP | 5-167391 A | 7/1993 |
| JP | 6-61791 A | 3/1994 |
| JP | 11-215112 A | 8/1999 |
| JP | 2000049661 A | 2/2000 |
| JP | 2000101394 A | 4/2000 |
| JP | 2002043893 A | 2/2002 |
| JP | 2003198283 A | 7/2003 |
| JP | 2005522173 A | 7/2005 |
| JP | 2005538597 A | 12/2005 |
| JP | 2006093884 A | 4/2006 |
| JP | 2306279703 A | 10/2006 |
| JP | 2007043654 A | 2/2007 |
| JP | 2007088699 A | 4/2007 |

OTHER PUBLICATIONS

International Search Report for PCT/JP2008/060259 mailed Sep. 9, 2008.

(Continued)

*Primary Examiner* — Lincoln Donovan
*Assistant Examiner* — William Hernandez

(57) ABSTRACT

The voltage-current converter of the present invention includes a converter input terminal, a converter output terminal, a voltage-current conversion unit for converting voltage that is applied as input to the converter input terminal to current, and a current extraction unit for intermittently extracting current from the output terminal of the voltage-current conversion unit and supplying this current as output from the converter output terminal.

12 Claims, 13 Drawing Sheets

OTHER PUBLICATIONS

R. Schaumann et al., "Design of Analog Filters", Oxford University Press Inc., 2001, pp. 628-631.
B. Pankiewicz et al., "A Field Programmable Analog Array for CMOS Continuous-Time OTA-C Filter Applications", IEEE Journal of Solid-State Circuits, vol. 37, No. 2, pp. 125-136, Feb. 2002.

S Xiao et al., "A Tunable Duty-Cycle-Controlled Switched-R-MOSFET-C CMOS Filter for Low-Voltage and High-Linearity Applications", IEEE ISCAS, vol. 1, pp. I-433-436, May 2004.

* cited by examiner

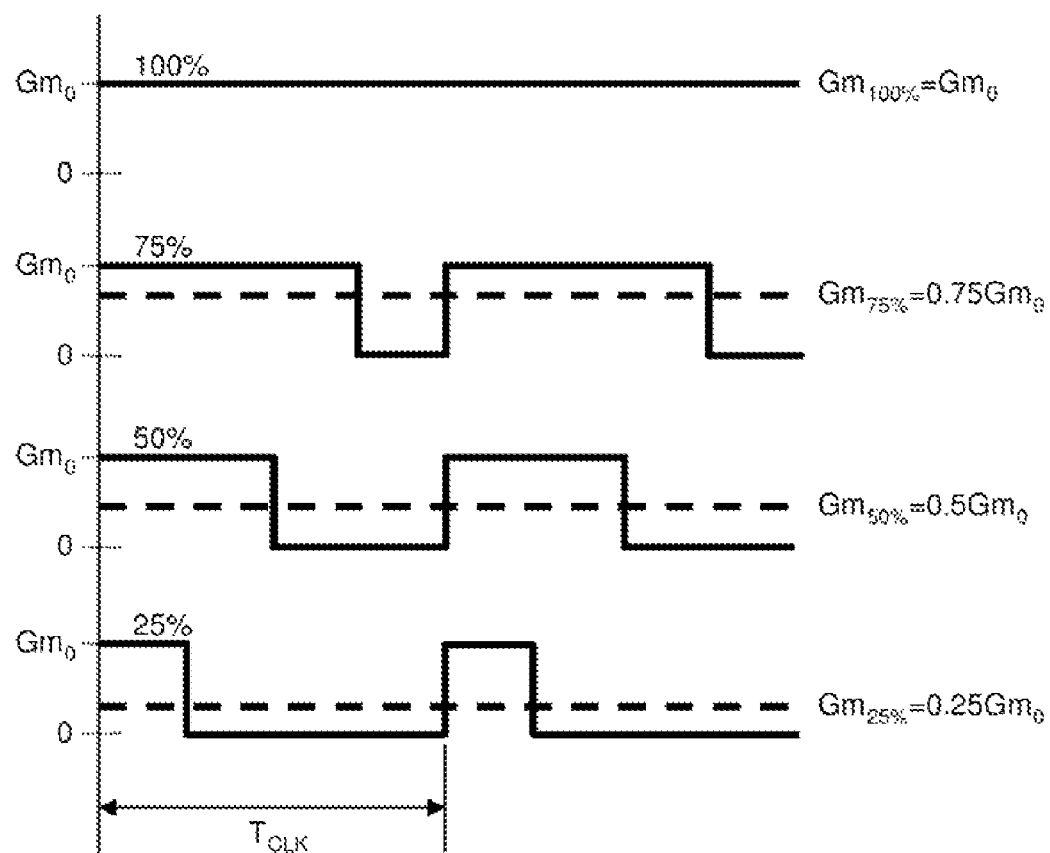

US 7,982,506 B2

VOLTAGE-CURRENT CONVERTER AND FILTER CIRCUIT USING SAME

This application is the National Phase of PCT/JP2008/060259, filed Jun. 4, 2008, which claims priority based on Japanese Patent Application No. 2007-149221 for which application was submitted on Jun. 5, 2007 and Japanese Patent Application No. 2007-263193 for which application was submitted on Oct. 9, 2007, and incorporates all of the disclosures of these applications.

TECHNICAL FIELD

The present invention relates to voltage-current converter having variable voltage-current conversion gain and to a filter circuit that uses the voltage-current converter, and more particularly, relates to a voltage-current converter having a small area and a broad range of variation of the voltage-current conversion gain even under conditions of low voltage, and to a filter circuit that uses this voltage-current converter.

BACKGROUND ART

Recent years has seen substantial development of multi-mode-compatible transceivers that can handle, in a single device, a plurality of wireless communication modes represented by, for example, IEEE (Institute of Electrical and Electronic Engineers) 802.11a/b/g and GSM (Global, System for Mobile Communications)/WCDMA (Wideband Code Division Multiple Access).

In such transceivers, design that uses micro-CMOS processing is indispensable for realizing complex signal processing at high speed while the limiting area and power consumption. However, adopting micro-CMOS processing raises the new problem of the increase of anomalies in performance or drops in the power-supply voltage.

A channel-selection filter that is incorporated as a filter circuit in such a multimode-compatible transceiver is required to feature small area and wide-range variability of such filter characteristics as bandwidth and gain, quality factor (Q), and order even under conditions of low voltage. In wireless standards that are Currently used in wireless communication according to the above-described wireless communication modes, channel bandwidth ranges from several kHz to several 100 MHz.

A Gm-C filter made up from a voltage-current converter (i.e., a Gm amplifier) and a capacitance element is typically used as a channel-selection filter (for example, see Non-Patent Document 1). In a multimode-compatible Gm-C filter, filter characteristics can be varied by controlling the voltage-current conversion gain of the Gm amplifier or the capacitance of the capacitance element. The method typically used for varying filter characteristics involves controlling the voltage-current conversion gain of the Gm amplifier by varying the bias conditions. However, the range of variability of bias voltage narrows with drops in the power-supply voltage, and the ability to vary the voltage-current conversion gain of a Gm amplifier over a wide range is therefore problematic.

The first example of the related art of a filter circuit for enabling variation of the voltage-current conversion gain over a wide range even under low voltage conditions is shown in FIG. 1A (for example, Non-Patent Document 2). The first example of the related art is a Gm-C filter made up from a voltage-current converter (i.e., a Gm amplifier) and a capacitance element C, the Gm amplifier being of a configuration that combines the voltage-current converter and the current-mirror circuit shown in FIG. 1B. In the first example of the related art, the voltage-current conversion gain of the Gm amplifier can be varied by switching paths inside the current-mirror circuit by means of switch circuits SW.

Similarly, the filter circuit of the second example of the related art is shown in FIG. 2 (for example, Non-Patent Document 3). The second example of the related art is of a configuration in which an active-RC filter constituted by operational amplifier OA, resistance elements R and Rx, and capacitance element C is further provided with switch circuits SW. In the second example of the related art, controlling the duty ratio of a clock that controls opening/closing of switch circuit SW enables variation of the effective resistance of resistor R, which carries out voltage-current conversion.

However, the filter circuits of the first and second examples of the related art have the following problems.

The problem of the first example of the related art is the difficulty of broadening the range of variability of the filter characteristics without bringing about an increase in the size of chip area. This problem arises because the first example of the related art requires the juxtaposition of a number of current-mirror circuits that is proportional to the range of variability, but because discrepancies in the threshold voltages of the MOSFETs must be limited, miniaturization of the area of each current-mirror circuit is difficult to achieve despite advances in micro-CMOS processing.

The problem of the second example of the related art is the inability to vary filter characteristics other than the bandwidth. Methods that can be considered for enabling variation of gain and the quality factor in this configuration include a method of juxtaposing resistors and then switching by means of switch circuits and a method of using MOSFETs as variable resistors, but the first method suffers from the problem of an increase in the size of the area and the second results in degraded linearity. Another problem of the second example of the related art is the need to also compensate for variations in performance by means of duty ratio control. In other words, because the range of variability realized by duty ratio control is split between two different types of objects, i.e., variation compensation and multi-mode compatibility, the range of variability for multi-mode compatibility is narrowed, and achieving a range of variability that is sufficient for multi-mode compatibility is therefore compromised.

Non-Patent Document 1: R. Schaumann and M. E. van Valkenburg, *Design of Analog Fillers*, Oxford University Press, 2001.
Non-Patent Document 2: IEEE JSSC, Vol. 37, No. 2, February 2002. pp. 125-136
Non-Patent. Document 3: IEEE ISCAS, Vol. 1, May 2004. pp. I-433-436

DISCLOSURE OF THE INVENTION

It is the first object of the present invention to provide a voltage-current converter that can broaden the range of variability of voltage-current conversion gain without an increase in the size of the area even under conditions of low voltage, and a filter circuit that uses this voltage-current converter.

It is a second object of the present invention to provide a filter circuit that enables independent control of each filter characteristic without an increase of the size of the area even under conditions of low voltage.

The voltage-current converter of the present invention is a voltage-current converter for converting input voltage to current and supplying the result as output and includes: a converter input terminal, a converter output terminal, a voltage-current conversion unit for converting voltage applied as input to the converter input terminal to current; and a current extraction unit for intermittently extracting current that flows from the output terminal of the voltage-current conversion unit and supplying the current from the converter output terminal.

The filter circuit of the present invention includes the voltage-current converter and a capacitance element that is connected to the converter output terminal of the voltage-current converter.

Due to the provision of a current extraction unit for intermittently extracting current that flows from the output terminal of the voltage-current conversion unit in the voltage-current converter of the present invention, the voltage-current conversion gain can be controlled by the intermittent operation ratio. This intermittent operation ratio can be controlled with high precision through the use of micro-CMOS processing, and in addition, enables variation over a broad range without bringing about performance degradation even under conditions of low voltage. In addition, there is virtually no increase in the size of the area because the current extraction unit can be realized as a logic circuit that can be configured by a micro-CMOS device. Accordingly, the effect of enabling a broadening of the range of variability of voltage-current conversion gain can be obtained without an increase in the size of the area even under conditions of low voltage.

In the filter circuit of the present invention, filter characteristics can be varied by controlling the voltage-current conversion gain of the voltage-current converter by means of the intermittent operation ratio, whereby the effect of enabling independent control of each filter characteristic is obtained.

BRIEF DESCRIPTION OF THE DRAWINGS

FIG. 3D shows the change over time of the voltage-current conversion gain of the voltage-current converter shown in FIG. 3A;

BEST MODE FOR CARRYING OUT THE INVENTION

The best mode for carrying out the present invention is next described with reference to the accompanying figures. In all of the figures described hereinbelow, identical constituent elements are given the same reference numbers, and explanations are omitted as appropriate.

First Embodiment

Figure 1A:
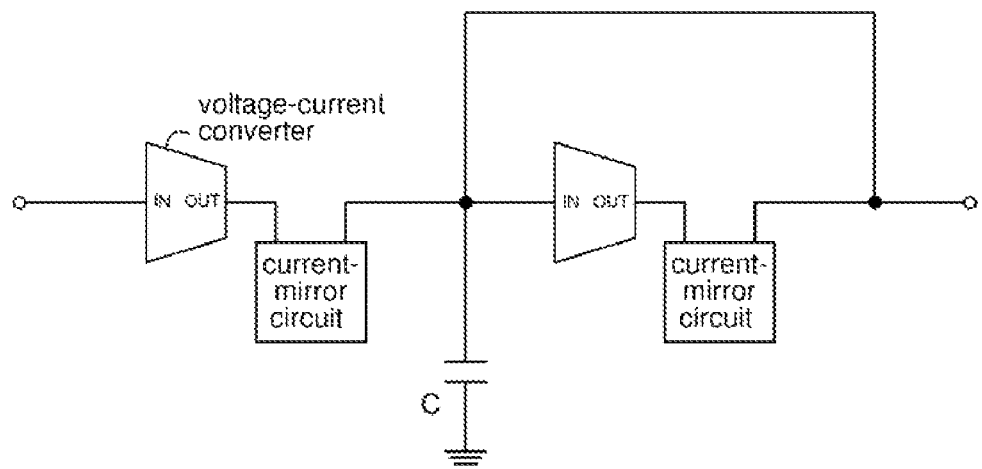
FIG. 1A shows the configuration of a filter circuit of a first example of the related art.
Figure 1B:
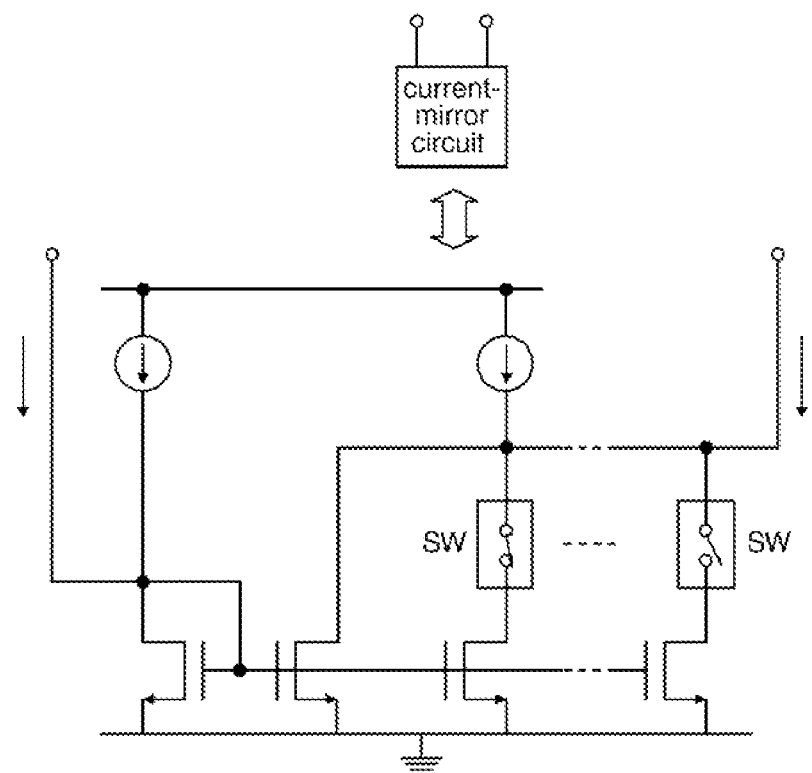
FIG. 1B shows the configuration of the current-mirror circuit shown in FIG. 1A.
Figure 2:
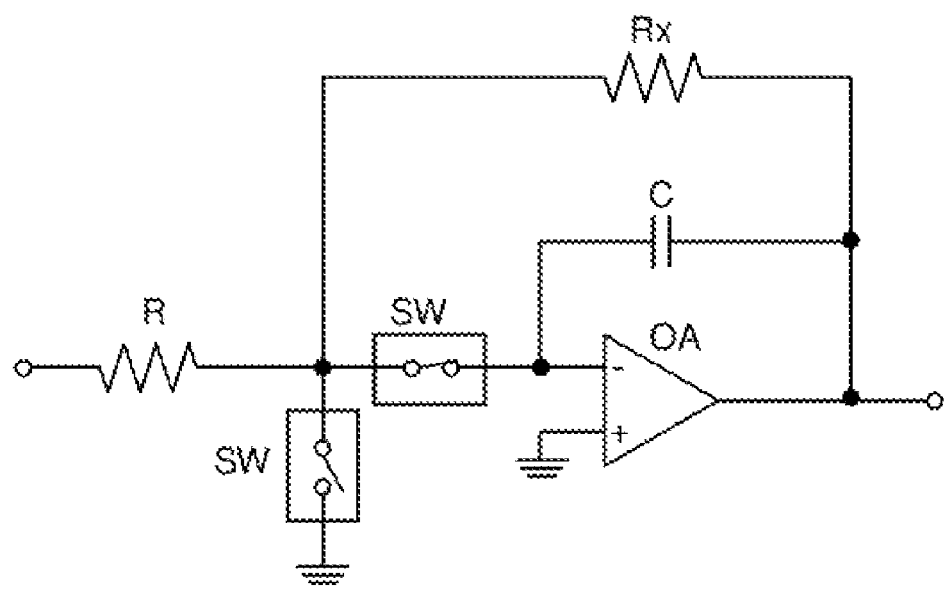
FIG. 2 shows the configuration of a filter circuit of a second example of the related art.
Figure 3A:
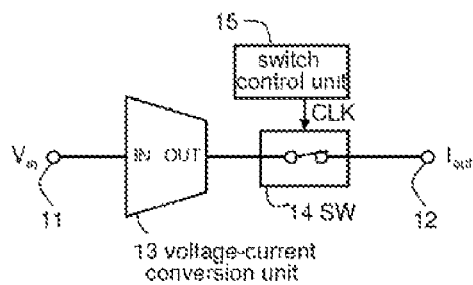
FIG. 3A shows the configuration of the voltage-current converter of the first embodiment of the present invention.

FIG. 3A shows the configuration of the voltage-current converter of the first embodiment of the present invention.

The voltage-current converter of the present embodiment includes: input terminal 11, output terminal 12, voltage-current conversion unit 13 for performing voltage-current conversion, switch circuit (SW) 14 connected between output terminal 12 and the output terminal of voltage-current conversion unit 13, and switch control unit 15 for controlling the switching of switch circuit 14.

Input terminal 11 is the converter input terminal, and output terminal 12 is the converter output terminal. Switch circuit 14 is one example of the first switching element. Switch circuit 14 and switch control unit 15 are constituent elements of the current extraction unit.

Figure 3B:
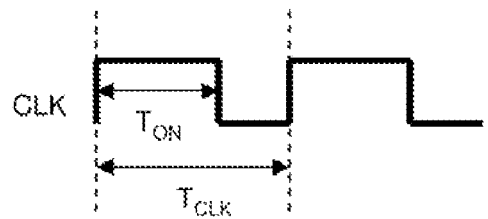
FIG. 3B is a timing chart of CLK shown in FIG. 3A.

Switch circuit 14 enters a closed state when control signal CLK supplied by switch control unit 15 is 1 and enters the open state when control signal CLK is 0. At this time, making control signal CLK a rectangular wave that repeats 0 (OFF) and 1 (ON) at a fixed period enables determination of the switching ratio of switch circuit 14 by means of the ON time ratio of CLK. FIG. 3B shows a timing chart of CLK.

Methods of obtaining control signal CLK that has the desired ON time ratio in switch control unit 15 include a method of internal generation and a method of selecting from a plurality of control signals CLK supplied from the outside.

The operating principles of the voltage-current converter of the present embodiment are next described using FIGS. 3A and 3B.

The voltage that is applied as input to input terminal 11 is converted to current by voltage-current conversion unit 13.

When switch circuit 14 is in the closed state, the current supplied from the output terminal of voltage-current conversion unit 13 is supplied without alteration from output terminal 12 and becomes the output current of the voltage-current converter of the present embodiment.

On the other hand, when switch circuit 14 is in the open state, output terminal 12 is cut off from voltage-current conversion unit 13 and the output current of the voltage-current converter of the present embodiment becomes 0.

In the above-described operations, the effective voltage-current conversion gain Gm when the output current of the voltage-current converter of the present embodiment is averaged over time is represented by the following formula (1).

Formula (1)

$$Gm = \frac{\int_0^{T_{ON}} Gm_0 dt + \int_{T_{ON}}^{T_{CLK}} 0 dt}{T_{CLK}} = \frac{T_{ON}}{T_{CLK}} Gm_0 \qquad (1)$$

In formula (1), $Gm_0$ is the voltage-current conversion gain of voltage-current conversion unit 13, $T_{CLK}$ is the period of CLK, and $T_{ON}$ is the ON time of CLK. Formula (1) shows that the effective voltage-current conversion gain Gm of the voltage-current converter of the present embodiment is determined by the ON time ratio of CLK (the ratio of $T_{ON}$ and $T_{CLK}$), i.e., the switching ratio of switch circuit 14.

Figure 3C:
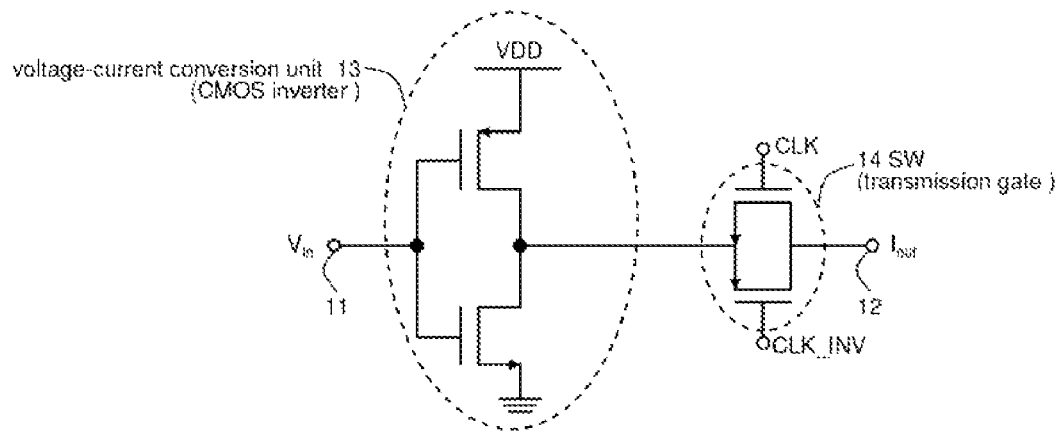
FIG. 3C shows an example of an actual circuit of the voltage-current converter shown in FIG. 3A.

FIG. 3C shows an actual example of the circuit of voltage-current converter of FIG. 3A.

Voltage-current conversion unit 13 can be realized by a CMOS inverter that carries out voltage-current conversion, and switch circuit 14 can be realized by a transmission gate realized by CMOS. Thus, switch circuit 14 that is newly added to the voltage-current converter of the present embodiment can be completely realized by a micro-CMOS device, whereby the increase in area due to switch circuit 14 is negligible.

The voltage-current converter of the present embodiment enables smaller area than the related art even when the switching ratio of switch circuit 14 is fixed and the voltage-current conversion gain is not variable. When small voltage-current conversion gain is to be realized in the related art, the W/L of a MOSFET must be reduced, but because the lower limit of W is determined by processing, L must be increased, resulting in a consequent increase in area. In contrast, in the voltage-current converter of the present embodiment, reducing the switching ratio of switch circuit 14 enables the realization of smaller voltage-current conversion gain, whereby the size of the MOSFET can be kept as is.

FIG. 3D shows the change over time of $I_{OUT}/V_{IN}$ when the input voltage to input terminal 11 is a fixed value $V_{IN}$ and the output current from output terminal 12 is $I_{OUT}$.

In FIG. 3D, the solid lilies show, in order from the top, the change over time of $I_{OUT}/V_{IN}$ when the switching ratio of switch circuit 14 is 100%, 75%, 50%, and 25%, and the dotted lines show the effective voltage-current conversion gain Gm when $I_{OUT}/V_{IN}$ is averaged over time.

Gm is $Gm_0$ (=the voltage-current conversion gain of voltage-current conversion unit 13) when the switching ratio of switch circuit 14 is 100%, but Gm can be set to 0.75 $Gm_0$, 0.50 $Gm_0$, and 0.25 $Gm_0$ by controlling the switching ratio to 75%, 50%, and 25% respectively.

In the voltage-current converter of the present embodiment, the current that flows from the output terminal of voltage-current conversion unit 13 is intermittently extracted, and Gm is controlled by this intermittent operation ratio. In this case, the intermittent operation ratio can be controlled with high accuracy by using micro-CMOS processing and can be varied over a broad range without causing deterioration of performance under conditions of low voltage. In addition, switch circuit 14 can be constructed from a micro-CMOS device and therefore brings about virtually no increase in the size of the area. Accordingly, the range of variability of Gm can be broadened with no increase in the size of the area and under conditions of low voltage.

The upper limit of the range of variability of the switching ratio of switch circuit 14 is 100%, i.e., the constant closed state, and the lower limit is 0%, i.e., the constant open state. Thus, based on formula (1), the range of variability of Gm is at least 0 but no greater than $Gm_0$, but a voltage-current converter in which Gm=0 is in actuality pointless. The lower limit of the actual range of variability of Gm is determined by the rise time and fall time of CLK. The error of the switching ratio of switch circuit 14 that arises from the rise time and fall time of CLK decreases as the frequency of CLK (=1/$T_{CLK}$) decreases, and the range of variability of Gm therefore widens with lower frequencies of CLK. In addition, the power consumption of switch control unit 15 that generates CLK decreases to the extent that the frequency of CLK decreases. On the other hand, the bandwidth of signals that can be processed by the voltage-current converter of the present embodiment is a range no greater than ½ the frequency of CLK because the influence of aliasing must be prevented. In other words, the higher the frequency of CLK, the broader the bandwidth of signals that can be processed.

When the voltage-current converter of the present embodiment is used to construct a filter circuit, the appropriate bandwidth of the filter circuit is in the order of from 100 kHz to 100 MHz. The reason for this is that in a narrow band that does not exceed 100 kHz, the area of the capacitance element becomes a determining factor, thus detracting from the advantage of suppressing an increase in chip area. In a band that exceeds 100 MHz, however, the accuracy of the switching ratio control of switch circuit 14 is degraded and the range of variability of Gm narrows, and further, the current consumption of switch control unit 15 increases.

The method of the related an for enabling variation of the voltage-current conversion gain by means of bias voltage control can also be combined and applied to voltage-current conversion unit 13, whereby performance variations can be sufficiently compensated by this conventional method. Accordingly, when setting the voltage-current conversion gain that results from the switching ratio control of switch circuit 14, filter characteristics can be varied over a broader range without the need for estimating an extra margin for variations in performance.

As can be seen from the forgoing explanation, the bandwidth of the filter circuit is from 100 kHz to 10 MHz, and the frequency of CLK is ideally in the order of 20 times the bandwidth of the filter circuit. This is because the ability to process a signal of a range that is in the order of ten times the bandwidth is sufficient for a channel-selection filter, and further, the use of a micro-CMOS process enables the generation of a CLK in the order of 200 MHz (20 times the maximum bandwidth) with sufficiently low current consumption and sufficiently high accuracy. However, this limit does not apply when the signal band is limited in advance by a steep pre-filter. For example, if the signal band is limited to 100 MHz or less by a pre-filter, a filter circuit of a bandwidth of 80 MHz at a CLK of 200 MHz can also be constructed. Further advances in miniaturization by micro-CMOS processing will enable processing of signals having a still broader band with high accuracy and low current consumption.

Second Embodiment

Figure 4A:
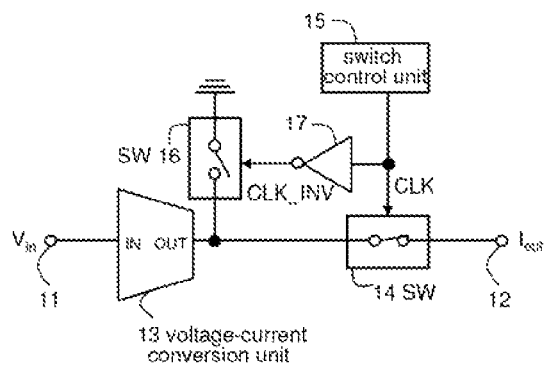
FIG. 4A shows the configuration of the voltage-current converter of the second embodiment of the present invention.

FIG. 4A shows the configuration of the voltage-current converter of the second embodiment of the present invention.

The difference of the voltage-current converter of the present embodiment from the first embodiment shown in FIG. 3A is the addition of: switch circuit (SW) 16 connected between the output terminal of voltage-current conversion unit 13 and a fixed potential and inverter element 17 that inverts control signal CLK from switch control unit 15 to produce inverted signal CLK_INV for controlling the switching of switch circuit 16.

Switch circuit 16 and inverter element 17 are constituent elements of the current extraction unit. In addition, switch circuit 16 is one example of the second switching element.

Figure 4B:
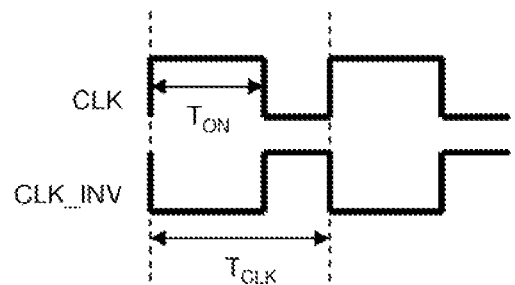
FIG. 4B is a timing chart of CLK and CLK_INV shown in FIG. 4A.

Switch circuit 16 enters a closed state when inverted signal CLK_INV is 1 (ON) and enters an open state when inverted signal CLK_INV is 0 (OFF). FIG. 4B shows a timing chart of CLK and CLK_INV.

When switch circuit 14 is in the open state and the output current is 0, the charge that accumulates in the parasitic capacitance of the output terminal of voltage-current conversion unit 13 becomes an error current when switch circuit 14 again enters the closed state (actually, because switch circuit 14 has a limited OFF resistance, the error current can be produced before the next closed state).

In the voltage-current converter of the present embodiment, placing switch circuit 16 in the closed state simultaneous with the time that switch circuit 14 enters the open state and making current that flows from the output terminal of voltage-current conversion unit 13 flow to a fixed potential can prevent the accumulation of charge that becomes an error current in the parasitic capacitance of the output terminal of voltage-current conversion unit 13.

Figure 4C:
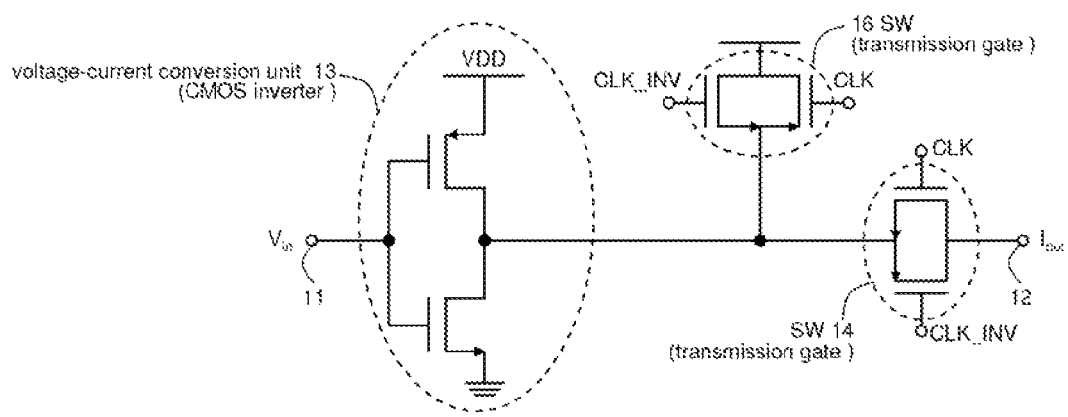
FIG. 4C shows an example of the actual circuit of the voltage-current converter shown in FIG. 4A.

FIG. 4C shows an actual example of the circuit of the voltage-current converter of FIG. 4A.

Switch circuit 16 can be realized by a transmission gate realized by CMOS. In this way, switch circuit 16 that is newly added to the voltage-current converter of the present embodiment can be entirely constituted by a micro-CMOS device, whereby the increase in area resulting from switch circuit 16 is negligible.

Third Embodiment

Figure 5:
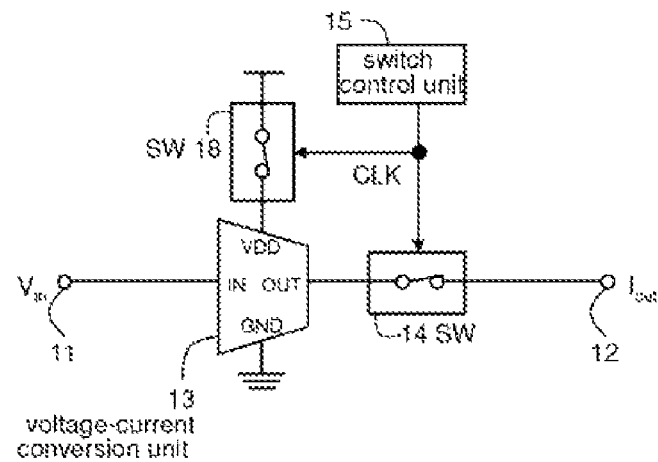
FIG. 5 shows the configuration of the voltage-current converter of the third embodiment of the present invention.

FIG. 5 shows the configuration of the voltage-current converter of the third embodiment of the present invention.

The difference of the voltage-current converter of the present embodiment from the first embodiment shown in FIG. 3A is the addition of switch circuit (SW) 18 that is connected between the power supply and power-supply terminal VDD of voltage-current conversion unit 13.

As with switch circuit 14, switch circuit 18 enters the closed state when control signal CLK is 1 (ON) and enters the open state when control signal CLK is 0 (OFF).

When switch circuit 14 enters the open state and the output current becomes 0 in the voltage-current converter of the present embodiment, switch circuit 18 also enters the open state, whereby current does not flow to voltage-current conversion unit 13 to enable suppression of current consumption.

The same effect can be obtained even when switch circuit 18 is connected between ground and ground terminal GND of voltage-current conversion unit 13.

Fourth Embodiment

Figure 6:
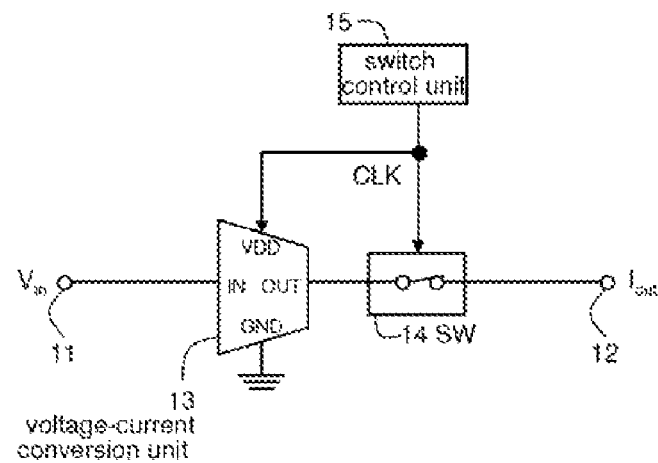
FIG. 6 shows the configuration of the voltage-current converter of the fourth embodiment of the present invention.

FIG. 6 shows the configuration of voltage-current converter of the fourth embodiment of the present invention.

The difference of the voltage-current converter of the present embodiment from the first embodiment shown in FIG. 3A is the use of control signal CLK for not only controlling the switching of switch circuit 14 but also for intermittently driving voltage-current conversion unit 13.

Power-supply terminal VDD of voltage-current conversion unit 13 is connected to switch control unit 15, and voltage-current conversion unit 13 enters a driven state when CLK is 1 (ON) and enters an inactive state when CLK is 0 (OFF). However, CLK must be a signal that supplies sufficient voltage as the power-supply voltage of voltage-current conversion unit 13 when CLK is 1.

In the voltage-current converter of the present embodiment, current does not flow to voltage-current conversion unit 13 when CLK becomes 0, whereby current consumption can be suppressed as in the third embodiment In addition, voltage-current conversion unit 13 can be driven not only from the power-supply terminal VDD side but can also be driven from the ground terminal GND side. In this case, voltage-current conversion unit 13 enters an inactive state when the control signal is 1 and enters a driven state when the control signal is 0, whereby the inverted signal CLK_INV of control signal CLK drives voltage-current conversion unit 13.

Fifth Embodiment

Figure 7:
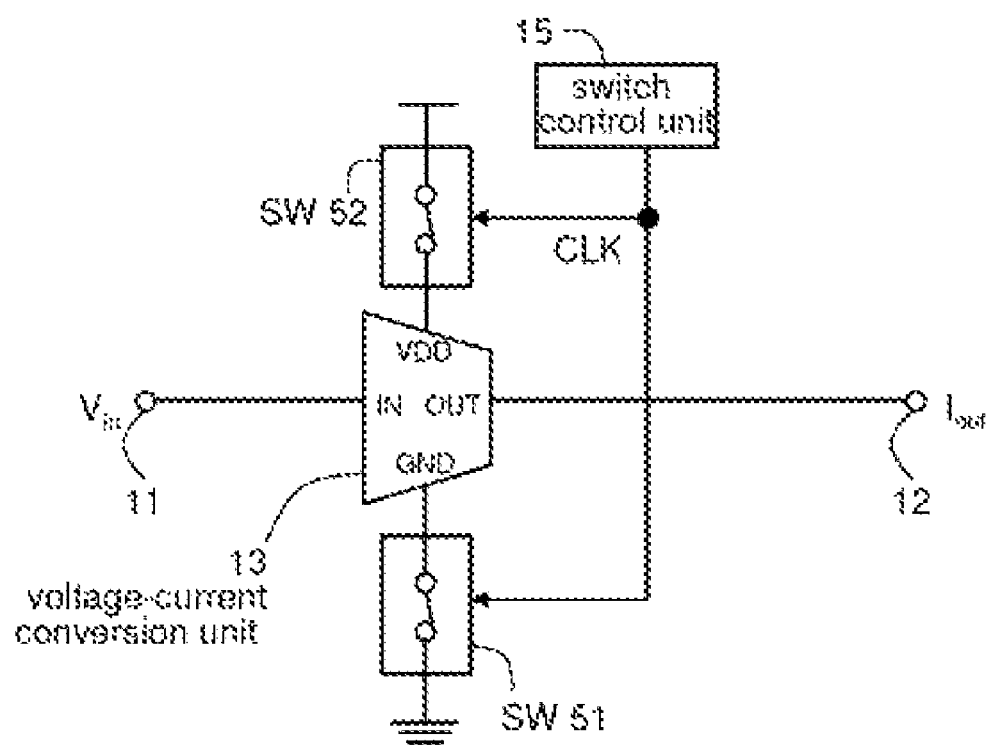
FIG. 7 shows the configuration of the voltage-current converter of the fifth embodiment of the present invention.

FIG. 7 shows the configuration of the voltage-current converter of the fifth embodiment of the present invention.

The difference of the voltage-current converter of the present embodiment from the first embodiment shown in FIG. 3A is the elimination of switch circuit (SW) 14 that is connected between output terminal 12 and the output terminal of voltage-current conversion unit 13 and the addition of switch circuit 51 that is connected to the ground terminal GND side of voltage-current conversion unit 13 and switch circuit 52 connected to the power-supply terminal VDD side. Switch circuit 51 or 52 is an example of the first switching element and serves as a constituent element of the current extraction unit.

Regarding the switching of switch circuits 51 and 52, the switches enter the closed state when control signal CLK is 1 (ON) and the open state when control signal CLK is 0 (OFF). At this time, voltage-current conversion unit 13 is in a driven state when CLK is 1 (ON) and is in an inactive state when CLK is 0 (OFF).

In the voltage-current converter of the present embodiment, current does not flow from output terminal 12 to ground terminal GND or power-supply terminal VDD of voltage-current conversion unit 13, or contrarily, does not flow out when CLK becomes 0, whereby switch circuit 14 is not required for preventing an error current. As a result, switch circuits that are connected in a series to the signal path are eliminated and the adverse effect upon nonlinearly or noise characteristics that is exerted upon the circuit by the ON resistance of a switch circuit can be eliminated. In addition, because no current flows to power-supply voltage-current conversion unit 13 at this time, current consumption can be suppressed, as in the third and fourth embodiments.

Although switch circuits were added to power-supply terminal VDD and ground terminal GND of voltage-current conversion unit 13 in the present embodiment, the same effect can be obtained by the ON/OFF control of the bias current of voltage-current conversion unit 13 without necessarily providing a switch circuit to the power-supply terminal or ground terminal of voltage-current conversion unit 13.

Sixth Embodiment

Figure 8A:
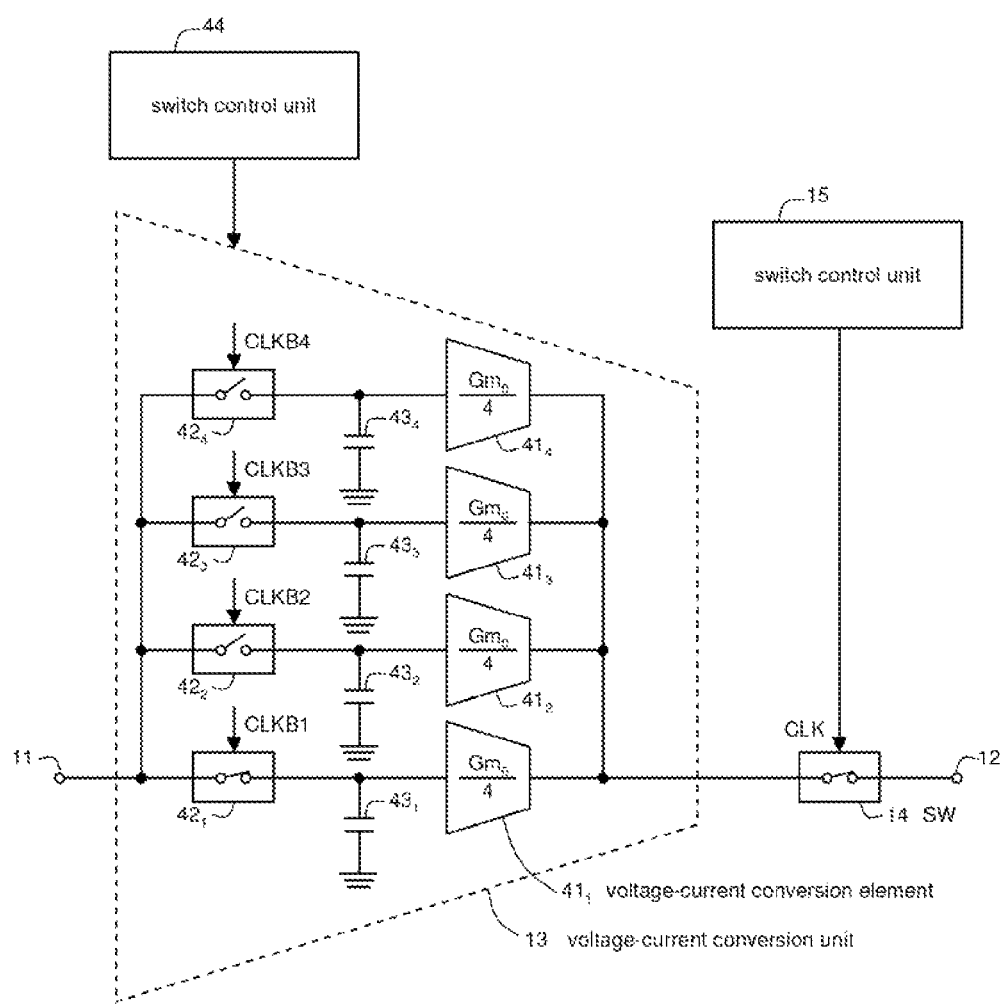
FIG. 8A shows the configuration of the voltage-current converter of the sixth embodiment of the present invention.

FIG. 8A shows the configuration of the voltage-current converter of the sixth embodiment of the present invention.

The difference of the voltage-current converter of the present embodiment from the first embodiment shown in FIG. 3A is that the conversion gain of voltage-current conversion unit 13 has a finite impulse response (FIR) filter characteristic, and that switching control unit 44 is added. Voltage-current conversion unit 13 of the present embodiment enables the effective elimination of aliasing noise in the signal band when sampling in the current extraction unit with virtually no increase of the size of the area and power consumption, as will be explained hereinbelow.

Voltage-current conversion unit 13 of the present embodiment includes: a number N (where N is a natural number equal to or greater than 2) of voltage-current conversion elements $41_1$-$41_N$; N switch circuits $42_1$-$42_N$ that are connected in a series between input terminal 11 and respective input terminals of voltage-current conversion elements $41_1$-$41_N$; and N capacitance elements $43_1$-$43_N$ that are connected between a fixed potential and respective input terminals of each of voltage-current conversion elements $41_1$-$41_N$. The switching of switch circuits $42_1$-$42_N$ is controlled by switch control unit 44. The conversion gain of each of voltage-current conversion elements $41_1$-$41_N$ is $Gm_0/N$. The output terminals of each of voltage-current conversion elements $41_1$-$41_N$ are short-circuited and connected to output terminal 12.

In FIG. 8A, N=4. In addition, switch circuits $42_1$-$42_N$ and capacitance elements $43_1$-$43_N$ are examples of constituent elements of a sampling-holding means for sampling and holding voltage that is received as input, and voltage-current conversion elements $41_1$-$41_N$ are examples of voltage-current conversion means for converting voltage, that has been sampled and held, to a current.

Figure 8B:
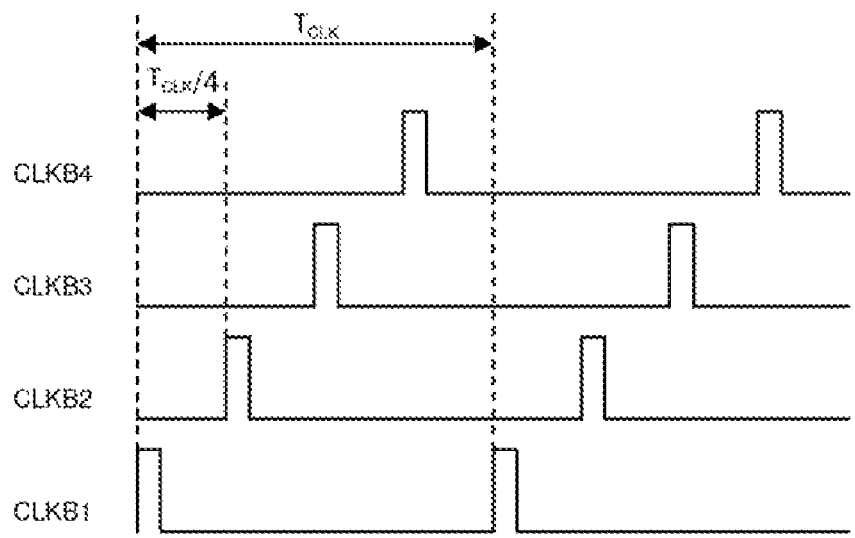
FIG. 8B is a timing chart of CLKB1-CLKB4 shown in FIG. 8A.

Switch control unit 44 supplies control clock signals CLKB1-CLKBN of N phases shown in FIG. 8B and thus controls the switching of each of switch circuits $42_1$-$42_N$. Any of switch circuits $42_1$-$42_N$ enters the closed state when a control clock signal is 1 (ON) and enters the open state when a control clock signal is 0 (OFF). The ON time of CLKB1-CLKBN is the time required from the time that switch circuits $42_1$-$42_N$ enter the closed state until the voltage of input terminal 11 equals the voltages of the input terminals of each of voltage-current conversion elements $41_1$-$41_N$.

Typically, the current consumption or area of circuits necessary for voltage-current conversion is proportional to the conversion gain, and the total current consumption or area of N voltage-current conversion elements $41_1$-$41_N$ for which the conversion gain is $Gm_0/N$ is therefore equivalent to voltage-current conversion unit 13 for which the conversion gain is $Gm_0$. In addition, switch control unit 44 and switch circuits $42_1$-$42_N$ are logic circuits that can be constituted by micro-CMOS devices. Capacitance elements $43_1$-$43_N$ can be exchanged for a micro capacitance that is parasitic to switch circuits $42_1$-$42_N$ and voltage-current conversion elements $41_1$-$41_N$. Accordingly, there is virtually no increase in power consumption or area due to the use of voltage-current conversion unit 13 of the present embodiment.

To explain the operations of voltage-current conversion unit 13 of the present embodiment, only the circuit composed of voltage-current conversion element $41_1$, switch circuit $42_1$, and capacitance element $43_1$ will first be considered. When CLKB1 turns ON, switch circuit $42_1$ enters the closed state and a charge that is proportional to input voltage Vin is accumulated in capacitance element $43_1$. Even after CLKB1 turns OFF, the charge at the instant that switch circuit $42_1$ enters the open state is held in capacitance element $43_1$, whereby the voltage of the input terminal of voltage-current conversion element $41_1$ is fixed unchanged at Vin. Accordingly, the current supplied by voltage-current conversion element $41_1$ during the time until CLKB1 next turns ON is fixed unchanged at $Gm_0 \cdot Vin/N$.

Voltage-current conversion elements $41_2$-$41_N$, switch circuits $42_2$-$42_N$, and capacitance elements $43_2$-$43_N$ also operate similarly, each at a different phase. Accordingly, voltage-current conversion unit 13 of the present embodiment as a whole carries out one sampling each time interval $T_{SB}=T_{CLK}/N$. In other words, the sampling frequency is $N/T_{CLK}$. Using $z^{-1}=\exp(-sT_{SB})$ that represents the delay for one sampling, when CLKB1 is ON, voltage-current conversion element $41_N$ holds current $z^{-1} \cdot Gm_0 \cdot Vin/N$ that corresponds to the input voltage of the time that precedes by time interval $T_{SB}$, and voltage-current conversion element $41_2$ holds current $z^{-(N-1)} \cdot Gm_0 \cdot Vin/N$ that corresponds to the input voltage that precedes by time interval $(N-1)T_{SB}$. The output currents of voltage-current conversion elements $41_1$-$41_N$ are added by short-circuiting the output terminals of each of voltage-current conversion element $41_1$-$41_N$ and are supplied from output terminal of voltage-current conversion unit 13. At this time, the conversion gain $Gm_{FIR0}$ of voltage-current conversion unit 13 of the present embodiment is represented by the following formula (2).

$$Gm_{FIRO} = (1 + z^{-1} + z^{-2} + \ldots + z^{-(N-1)}) \frac{Gm_0}{N} \qquad (2)$$

Figure 8C:
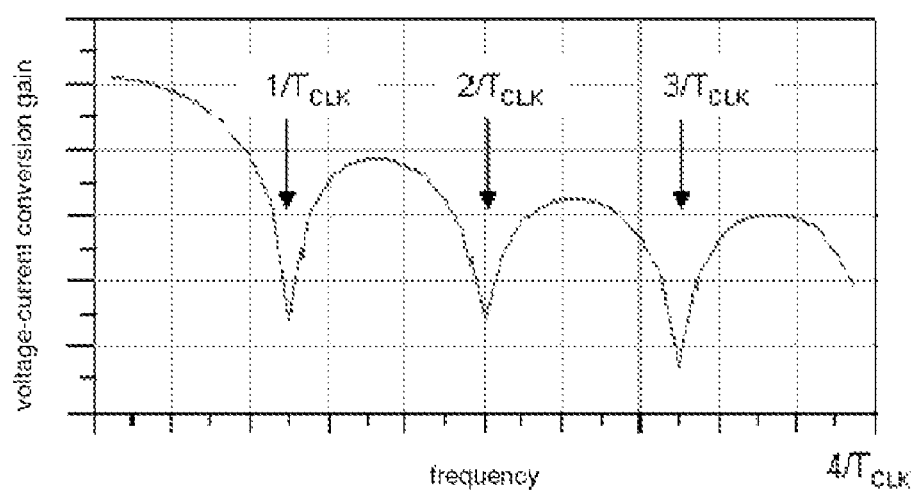
FIG. 8C shows the frequency characteristic of the voltage-current converter shown in FIG. 8A.

Formula (2) shows that the conversion gain of voltage-current conversion unit 13 of the present embodiment has the frequency characteristic of a moving average filter, which is one form of the FIR filter. A moving average filter has (N−1) zeros in a band of $N/T_{CLK}$ or less, the zero frequency being represented by $n/T_{CLK}$ (where n is any natural number other than N). FIG. 8C shows the moving average filter frequency characteristic when N=4 and $1/T_{CLK}$=250 MHz.

The conversion gain $Gm_{FIR}$ of the voltage-current converter of the present embodiment is represented by formula (3) below.

Formula (3)

$$Gm_{FIR} = (1 + z^{-1} + z^{-2} + \ldots + z^{-(N-1)}) \left(\frac{T_{ON}}{T_{CLK}}\right) \frac{Gm_0}{N} \qquad (3)$$

In the voltage-current converter of the present embodiment, the sampling frequency of the current extraction unit matches the frequency of the zero points of the FIR filter characteristic of voltage-current conversion unit 13. In other words, the FIR filter effectively eliminates aliasing noise within the band in the sampling in the current extraction unit. Accordingly, the cutoff characteristic of the prefilter of the voltage-current converter of the present embodiment may be relaxed and the area and power consumption of the prefilter can be suppressed.

Seventh Embodiment

Figure 9A:
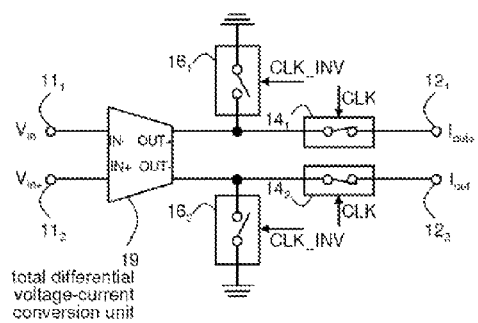
FIG. 9A shows the configuration of the voltage-current converter of the seventh embodiment of the present invention.

FIG. 9A shows the configuration of the voltage-current converter of the seventh embodiment of the present invention.

The voltage-current converter of the present embodiment is characterized by the adoption of a total differential voltage-current converter that differentiates the voltage-current converter of the second embodiment shown in FIG. 4A.

In FIG. 9A, total differential voltage-current conversion unit 19 corresponds to voltage-current conversion unit 13 of FIG. 4A, input terminals $11_1$ and $11_2$ correspond to input terminal 11 of FIG. 4A, output terminals $12_1$ and $12_2$ correspond to output terminal 12 of FIG. 4A, switch circuits $14_1$ and $14_2$ correspond to switch circuit 14 of FIG. 4A, and switch circuits $16_1$ and $16_2$ correspond to switch circuit 16 of FIG. 4A. In addition, switch control unit 15 of FIG. 4A is omitted. The timing chart of control signal CLK and inverted signal CLK_INV in FIG. 9A is identical to the timing chart shown in FIG. 4B.

Figure 9B:
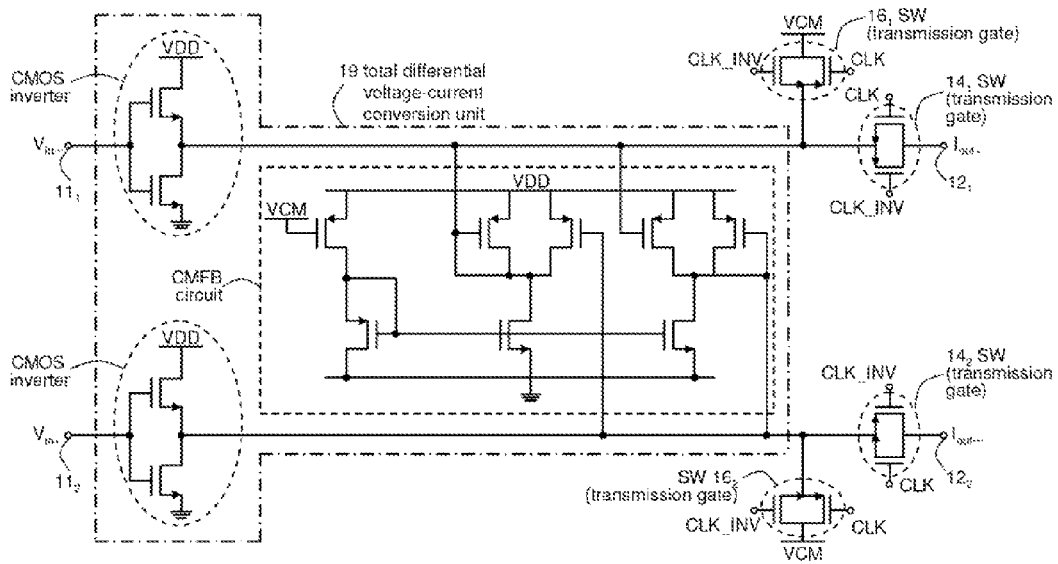
FIG. 9B shows an example of the actual circuit of the voltage-current converter shown in FIG. 9A.

FIG. 9B shows an actual example of the circuit of voltage-current converter of FIG. 9A.

Total differential voltage-current conversion unit 19 can be realized by combining two CMOS inverters for carrying out voltage-current conversion with a common-mode feedback (CMFB) circuit for holding an output common-mode voltage at a fixed value VCM, and switch circuits $14_1$, $14_2$, $16_1$, and $16_2$ can be realized by transmission gates by CMOS. Switch circuits $14_1$, $14_2$, $16_1$, and $16_2$ that are newly added to the voltage-current converter of the present embodiment can thus all be constituted by micro-CMOS devices, whereby the increase in the size of the area due to switch circuits $14_1$, $14_2$, $16_1$, and $16_2$ is negligible.

The voltage-current converters of the first, third, and fourth embodiments can also be similarly differentiated.

Eighth Embodiment

Figure 10:
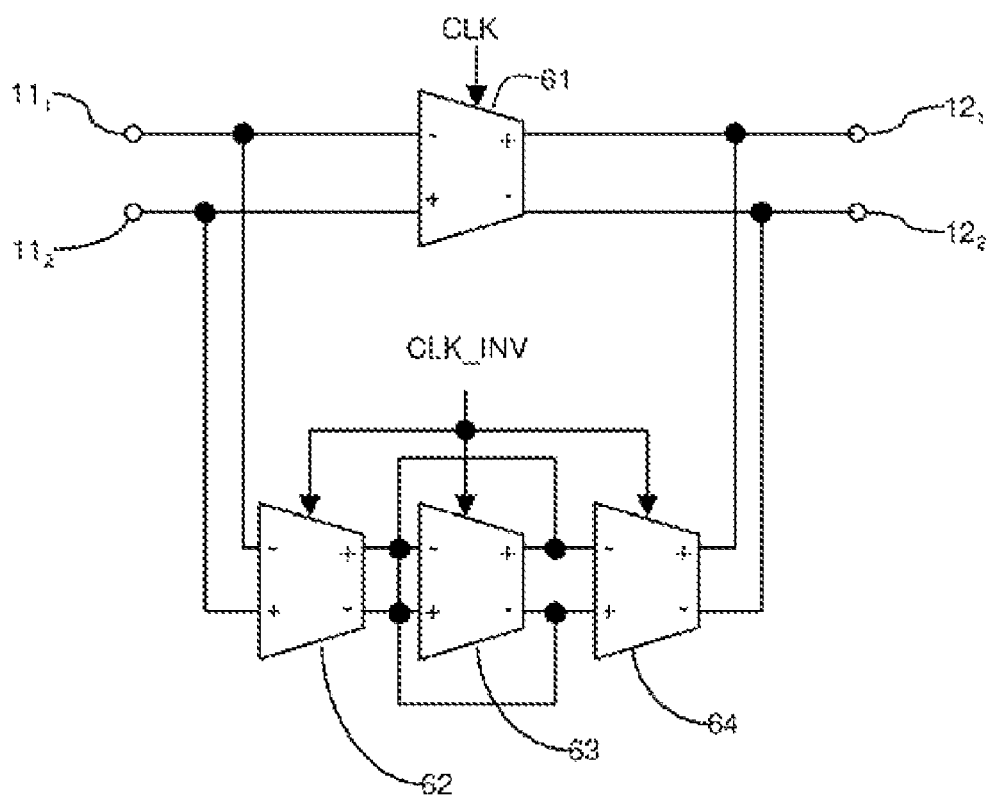
FIG. 10 shows the configuration of the voltage-current converter of the eighth embodiment of the present invention.

FIG. 10 shows the configuration of the voltage-current converter of the eighth embodiment of the present invention.

The point of difference of the voltage-current converter of the present embodiment is the addition of a circuit, in which total differential voltage-current converters 62, 63, and 64 are connected in series, in parallel with total differential voltage-current converter 61 that is equivalent to total differential voltage-current converter 19 of the seventh embodiment shown in FIG. 9A. The differential output terminal of total differential voltage-current converter 62 is short-circuited. In addition, the input and output terminals of total differential voltage-current converter 63 are short-circuited.

The operation of the total differential voltage-current converter of the present embodiment is next explained.

Total differential voltage-current converter 61 operates when control signal CLK is 1 (ON), and total differential voltage-current converters 62, 63, and 64 operate when inverted signal CLK_INV of control signal CLK is 1 (ON).

In FIG. 10, total differential voltage-current converter 62 acts to cancel the error current that is injected into the signal path by way of capacitance that is parasitic to a switch circuit provided in total differential voltage-current converter 61. In addition, because the differential output terminal of total differential voltage-current converter 62 is short-circuited, current that corresponds to voltage that is applied as input to input terminals $11_1$ and $11_2$ of the present embodiment is added and averaged. As a result, the differential signal component is canceled, and only a common-mode signal component is detected as current and is supplied from total differential voltage-current converter 62.

The common-mode signal current that is supplied from total differential voltage-current converter 62 is converted to voltage by total differential voltage-current converter 63 for which the input/output terminals are short-circuited. At this time, the alternating-current common-mode voltage sign is inverted.

Voltage-current converter 64 supplies current that corresponds to the negative common-mode voltage that is detected by voltage-current converters 62 and 63. At this time, total differential voltage-current converter 64 acts to keep the output impedance fixed when viewed from output terminals $12_1$ and $12_2$ of the present embodiment whether CLK is 1 (ON) or CLK is 0 (OFF). Total differential voltage-current converter 64 further acts to cancel the error current by way of capacitance that is parasitic to the switch circuit provided in total differential voltage-current converter 61.

To obtain the above-described effects, total differential voltage-current converters 62, 63, and 64 are preferably the same circuit as total differential voltage-current converter 61. In particular, the areas of MOS devices that make up the circuits are preferably made uniform with the object of canceling error current.

The same configuration can be adopted for voltage-current converters that differentiate the first, third, fourth, and fifth embodiments. In addition, total differential voltage-current converters 62, 63, and 64 need not be caused to operate only when control signal CLK_INV is 1 (ON) and may be caused to operate constantly. The effect of eliminating the common-mode signal can be obtained by adopting this approach. Still further, methods can also be adopted in which total differential voltage-current converters 62 and 63 are caused to operate constantly and only total differential voltage-current converter 64 is caused to operate when CLK_INV is 1 (ON), or conversely, in which total differential voltage-current converters 62 and 63 are caused to operated when CLK_INV is 1 (ON) and only total differential voltage-current converter 63 is caused to operate constantly.

Ninth Embodiment

Figure 11:
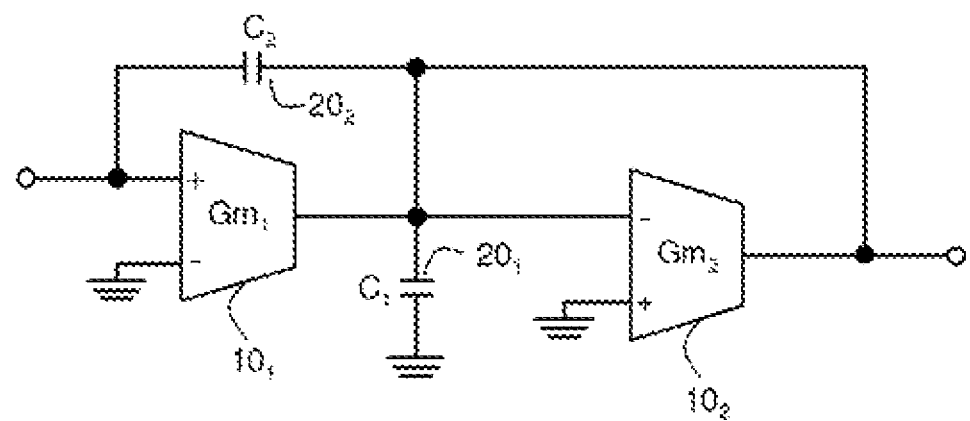
FIG. 11 shows the configuration of the filter circuit of the ninth embodiment of the present invention.

FIG. 11 shows the configuration of the filter circuit of the ninth embodiment of the present invention.

The filter circuit of the present embodiment is a single-end primary filter circuit and includes: voltage-current converters $10_1$ and $10_2$ shown in FIG. 3A or FIG. 4A, capacitance element $20_1$ that is connected between ground and the output terminal of voltage-current converter $10_1$, and capacitance element $20_2$ that is connected between the input and output terminals of voltage-current converter $10_1$.

The transfer function of this filter circuit is shown in formula (4).

Formula (4)

$$F(s) = \frac{sC_2 + Gm_1}{s(C_1 + C_2) + Gm_2} \quad (4)$$

In formula (4), $Gm_1$ and $Gm_2$ are the voltage-current conversion gains of voltage-current converters $10_1$ and $10_2$, respectively, and $C_1$ and $C_2$ are the capacitance values of capacitance elements $20_1$ and $20_2$, respectively.

Formula (4) shows that the filter circuit of the present embodiment can be configured as a low-pass type by taking $C_2$ as 0, as a high-pass type by taking $Gm_1$ as 0, and as an all-pass type by taking $Gm_1$ as $-Gm_2$ and $C_1$ as 0 (Non-Patent Document 1). The positions of zeros are determined by $C_2$ and $Gm_1$, and the positions of poles are determined by $C_1$, $C_2$, and $Gm_2$. The filter circuit of the present embodiment can be applied to this type of typical Gm-C filter.

Figure 12:
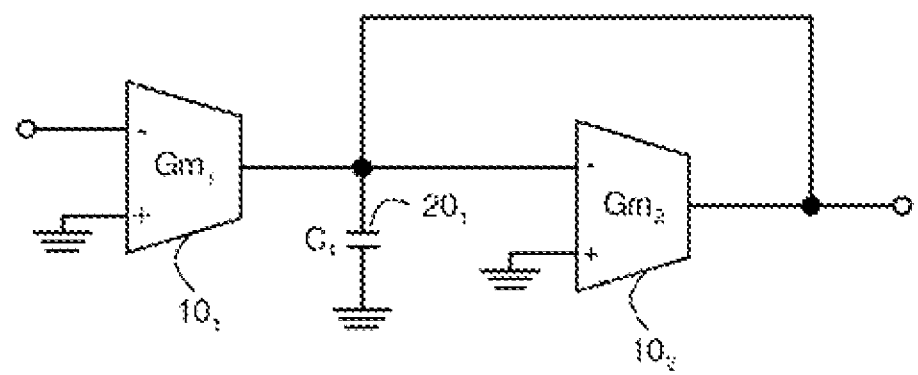
FIG. 12 shows the configuration when $C_2=0$ in the filter circuit shown in FIG. 11.

In the filter circuit of the present embodiment, the low-pass filter circuit obtained by taking $C_2$ as 0 is particularly well used. The configuration of this low-pass filter circuit is shown in FIG. 12. The transfer function at this time is shown in formula (5).

Formula (5)

$$F(s) = -\frac{Gm_1}{sC_1 + Gm_2} \quad (5)$$

Based on formula (5), the DC gain and bandwidth (BW) of this filter circuit are represented by the following formula (6).

$$\left.\begin{array}{l} \text{Gain} = \dfrac{Gm_1}{Gm_2} \\ BW = \dfrac{1}{2\pi}\dfrac{Gm_2}{C_1} \end{array}\right\} \quad (6)$$

In the low-pass filter circuit of the present embodiment, independently controlling each of the voltage-current conversion gains $Gm_1$ and $Gm_2$ of voltage-current converters $10_1$ and $10_2$, respectively, enables the independent variation of the bandwidth and DC gain. Methods for controlling the switching ratio of a plurality of voltage-current converters include a method in which control signals CLK are used so that all have equal periods and so that each have different ON times, or a method in which control signals CLK are used so that all have equal ON times and so that each have different periods.

Even when the switching ratio of switch circuit 14 is fixed and the filter characteristic is not variable, the filter circuit of the present embodiment enables a smaller area than a conventional circuit. As described hereinabove, this effect is obtained because the voltage-current converters that make up the filter circuit can be made smaller in area than the conventional art.

Tenth Embodiment

Figure 13:
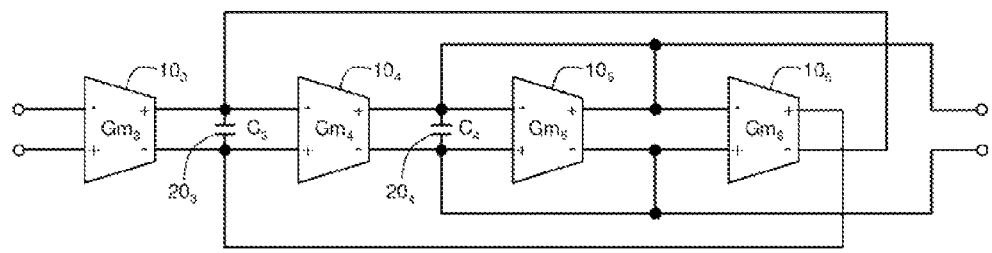
FIG. 13 shows the configuration of the filter circuit of the tenth embodiment of the present invention.

FIG. 13 shows the configuration of the filter circuit of the tenth embodiment of the present invention.

The filter circuit of the present embodiment is a total differential multi-mode compatible secondary filter circuit and includes: total differential voltage-current converters $10_3$-$10_6$ shown in FIG. 9A, and capacitance elements $20_3$ and $20_4$ each connected between the differential output terminals of total differential voltage-current converters $10_3$ and $10_4$, respectively.

Formula (7) shows the transfer function of this filter circuit.

Formula (7)

$$F(s) = \dfrac{\dfrac{Gm_3}{C_3}\dfrac{Gm_4}{C_4}}{s^2 + \dfrac{Gm_5}{C_3}s + \dfrac{Gm_4}{C_3}\dfrac{Gm_6}{C_4}} \quad (7)$$

In formula (7), $Gm_3$-$Gm_6$ are the voltage-current conversion gains of total differential voltage-current converters $10_3$-$10_6$, respectively; and $C_3$ and $C_4$ are the capacitance values of capacitance elements $20_3$ and $20_4$, respectively.

From formula (7), the DC gain (Gain), bandwidth (BW), and quality factor (Q) of this filter circuit are represented by the following formulas (8):

Formula (8)

$$\left.\begin{array}{l} \text{Gain} = \dfrac{Gm_3}{Gm_6} \\ BW = \dfrac{1}{2\pi}\sqrt{\dfrac{Gm_4}{C_3}\dfrac{Gm_6}{C_4}} \\ Q = \dfrac{\sqrt{Gm_4 Gm_6}}{Gm_5}\sqrt{\dfrac{C_3}{C_4}} \end{array}\right\} \quad (8)$$

In the filter circuit of the present embodiment, independently controlling each of the voltage-current conversion gains $Gm_3$-$Gm_6$ of total differential voltage-current converters $10_3$-$10_6$ enables independent variation of the bandwidth, DC gain, and quality factor. Methods for controlling the switching ratio of a plurality of total differential voltage-current converters include a method in which control signals CLK are used so that all have equal periods and so that each have different ON times, or a method in which control signals CLK are used so that all have equal ON times and so that each have different periods.

As described hereinabove, the bandwidth of the filter circuit is preferably from 100 kHz to 10 MHz. When the capacitance values and range of variability of the bandwidth are determined, the ranges of variability of $Gm_4$ and $Gm_6$ are determined, and further, when the range of variability of $Gm_3$ and $Gm_5$ is determined, the range of variability of the quality factor and DC gain is determined. The capacitance values are preferably in the order of several pF from the standpoint of noise and chip area, and in this case, a range of variability of DC gain in the order of −12-6 dB and a range of variability of quality factor in the order of 0.5-5 are appropriate.

Eleventh Embodiment

Figure 14:
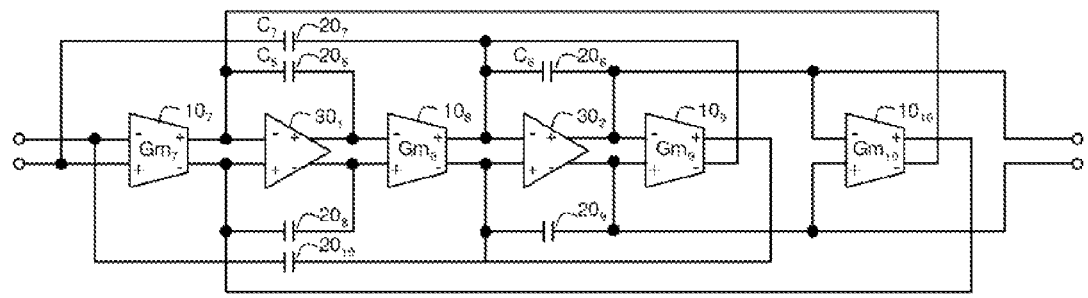
FIG. 14 shows the configuration of the filter circuit of the eleventh embodiment of the present invention.

FIG. 14 shows the configuration of the filter circuit of the eleventh embodiment of the present invention.

The filter circuit of the present embodiment is a total differential multimode-compatible secondary filter circuit, and includes: total differential voltage-current converters $10_7$-$10_{10}$ shown in FIG. 9A in a cascade connection; operational amplifier $30_1$ connected between the stages of total differential voltage-current converters $10_7$ and $10_8$; operational amplifier $30_2$ connected between the stages of total differential voltage-current converters $10_8$ and $10_9$; capacitance elements $20_5$ and $20_8$ connected between the input and output terminals of operational amplifier $30_1$; capacitance elements $20_6$ and $20_9$ connected between the input and output terminals of operational amplifier $30_2$; and capacitance elements $20_7$ and $20_{10}$ connected between the input terminals of total differential voltage-current converter $10_7$ and the output terminals of total differential voltage-current converters $10_8$ and $10_{10}$.

In the filter circuit of the present embodiment, the output terminals of total differential voltage-current converters $10_7$ and $10_8$ are each connected to the virtual ground point of operational amplifiers $30_1$ and $30_2$, respectively. The charging and discharging of the parasitic capacitance of the output terminals of total differential voltage-current converters $10_7$ and $10_8$ is thus eliminated and the transfer function of the filter circuit thus has no relation to the parasitic capacitance value, whereby error of the transfer function can be suppressed. In addition, because a large signal voltage no longer need be processed at the output stages of total differential voltage-current converters $10_7$ and $10_8$, degradation of linearity due to total differential voltage-current converters $10_7$ and $10_8$ can be suppressed.

Formula (9) shows the transfer function of this filter circuit.

Formula (9)

$$F(s) = -\frac{\frac{C_7}{C_6}s^2 + \frac{Gm_7}{C_5}\frac{Gm_8}{C_6}}{s^2 + \frac{Gm_9}{C_5}s + \frac{Gm_8}{C_5}\frac{Gm_{10}}{C_6}} \quad (9)$$

In formula (9), $Gm_7$-$Gm_{10}$ are the voltage-current conversion gains of total differential voltage-current converters $10_7$-$10_{10}$, respectively, and $C_5$-$C_7$ are the capacitance values of capacitance elements $20_5$-$20_7$, respectively.

From formula (9), the DC gain (Gain), bandwidth (BW), quality factor (Q), and zero-point angular frequency ($\omega_{zero}$) are each represented by the following formula 10.

Formula (10)

$$\begin{aligned} \text{Gain} &= \frac{Gm_7}{Gm_{10}} \\ BW &= \frac{1}{2\pi}\sqrt{\frac{Gm_8}{C_5}\frac{Gm_{10}}{C_6}} \\ Q &= \frac{\sqrt{Gm_8 Gm_{10}}}{Gm_9}\sqrt{\frac{C_5}{C_7}} \\ \omega_{zero} &= \sqrt{\frac{Gm_7 Gm_8}{C_5 C_7}} \end{aligned} \quad (10)$$

In the filter circuit of the present embodiment, independently controlling each of the voltage-current conversion gains $Gm_7$-$Gm_{10}$ of total differential voltage-current converters $10_7$-$10_{10}$ enables variation of the zero-point positions in addition to the bandwidth, the quality factor, and the DC gain.

Twelfth Embodiment

Figure 15:
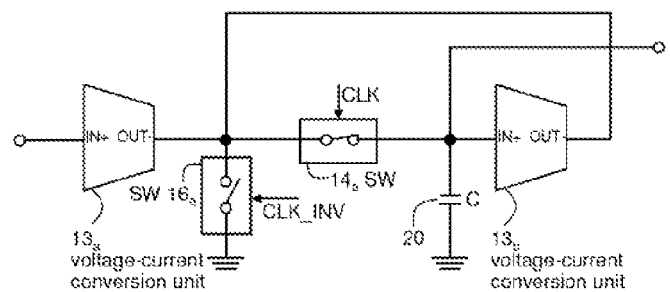
FIG. 15 shows the configuration of the filter circuit of the twelfth embodiment of the present invention.

FIG. 15 shows the configuration of the filter circuit of the twelfth embodiment of the present invention.

The filter circuit of the present embodiment is a primary variable band filter circuit and includes: voltage-current conversion units $13_a$ and $13_b$, switch circuits $14_a$ and $16_b$, and capacitance element 20.

The filter circuit of the present embodiment is characterized by the extraction by a single current extraction unit of current that flows from each of the output terminals of two voltage-current conversion units $13_a$ and $13_b$ that are provided inside each voltage-current converter in FIG. 4A. In FIG. 15, switch circuit $14_a$ corresponds to switch circuit 14 in FIG. 4A, switch circuit $16_a$ corresponds to switch circuit 16 in FIG. 4A, and switch control unit 15 of FIG. 4A is omitted.

In the filter circuit of the present embodiment, the extraction by a single current extraction unit of current that flows from the output terminals of each of two voltage-current conversion units $13_a$ and $13_b$ enables a reduction of the number of switch circuits, whereby not only can the size of the area due to the switch circuits be reduced, but the effects of distortion and noise caused by switch circuits can be reduced. In addition, due to the reduction of the number of switch circuits, the current consumption for driving the switch circuits can be reduced.

Formula (11) shows the transfer function $F_1(s)$ of this filter circuit.

Formula (11)

$$F_1(s) = -\frac{\frac{Gm_a}{C}}{s + \frac{Gm_b}{C}} \quad (11)$$

In formula (11), $Gm_a$ and $Gm_b$ are the voltage-current conversion gains of voltage-current conversion unit $13_a$ and $13_b$, respectively, and C is the capacitance value of capacitance element 20. In addition, $Gm_a$ and $Gm_b$ are represented by the following formula (12)

Formula (12)

$$\begin{aligned} Gm_a &= \frac{T_{ON}}{T_{CLK}}Gm_{a0} \\ Gm_b &= \frac{T_{ON}}{T_{CLK}}Gm_{b0} \end{aligned} \quad (12)$$

In formula (12), $Gm_{a0}$ and $Gm_{b0}$ are $Gm_a$ and $Gm_b$, respectively, when the switching ratio of switch circuit $14_a$ is 100%, $T_{CLK}$ is the period of CLK, and $T_{ON}$ is the ON time of CLK. Based on formula (12), $Gm_a$ and $Gm_b$ can be seen to be proportional to the switching ratio of switch circuit $14_a$. As a result, when the switching ratio of switch circuit $14_a$ is made a multiple of K, transfer function $F_2(s)$ is represented by formula (13).

Formula (13)

$$F_2(s) = -\frac{\frac{K \cdot Gm_a}{C}}{s + \frac{K \cdot Gm_b}{C}} = -\frac{\frac{Gm_a}{C}}{\frac{s}{K} + \frac{Gm_b}{C}} = F_1\left(\frac{s}{K}\right) \quad (13)$$

Formula (13) shows that $F_2(s)$ is the transfer function when $F_1(s)$ relating to frequency is scaled to a multiple of K. In other words, formula (13) shows that controlling the switching ratio of switch circuit $14_a$ enables variation of the bandwidth.

Although the invention of the present application has been shown with reference to the embodiments, the invention of the present application is not limited to the above-described embodiments. The configuration and details of the invention of the present application are open to various modifications within the scope of the invention of the present application that will be readily understood by a person of ordinary skill in the art.

What is claimed is:

1. A voltage-current converter for converting voltage that is received as input to current and supplying the result, said voltage-current converter comprising:
    a converter input terminal;
    a converter output terminal;
    a voltage-current conversion unit for converting voltage that is applied as input to said converter input terminal to current; and
    a current extraction unit for intermittently extracting current from an output terminal of said voltage-current conversion unit and supplying this current from said converter output terminal, wherein said current extraction unit includes:
- a first switching element connected between said converter output terminal and the output terminal of said voltage-current conversion unit;
- a second switching element that is connected between a fixed potential and the output terminal of said voltage-current conversion unit and that switches at a timing that is the reverse of said first switching element;
- a switch control unit for controlling switching of said first switching element;
- wherein an intermittent operation ratio when intermittently extracting current from the output terminal of said voltage-current conversion unit is controlled by a switching ratio of said first switching element.

2. The voltage-current converter as set forth in claim 1, wherein said voltage-current conversion unit is driven intermittently at the same timing as said first switching element.

3. The voltage-current converter as set forth in claim 1, wherein switching of said first switching element is controlled by a square wave, and the switching ratio is controlled by the ratio of the ON time of the square wave.

4. The voltage-current converter as set forth in claim 1, wherein conversion gain of said voltage-current conversion unit has a finite impulse response filter characteristic.

5. The voltage-current converter as set forth in claim 4, wherein:
- said voltage-current conversion unit includes a number N (where N is a natural number equal to or greater than 2) of each of sampling-holding means for sampling and holding voltage that is applied as input to said converter input terminal and voltage-current conversion means for converting voltage that is sampled and held by said sampling-holding means to current; and
- causing the number N of said sampling-holding means to each operate at a different timing of N phases and adding the current that flows through the output terminal of each of N said voltage-current conversion means causes the conversion gain of said voltage-current conversion unit to have an N-order finite impulse response filter characteristic.

6. A filter circuit comprising:
- the voltage-current converter as set forth in claim 1; and
- a capacitance element connected to said converter output terminal of said voltage-current converter.

7. The filter circuit as set forth in claim 6, wherein said filter circuit includes a plurality of said voltage-current converters, wherein independently controlling the intermittent operation of the current extraction unit of each of said plurality of voltage-current converters enables independent variation of each of a plurality of filter characteristics.

8. The filter circuit as set forth in claim 6, wherein said filter circuit includes a plurality of said voltage-current conversion units, and current from output terminals of said plurality of voltage-current conversion unit is extracted by one current extraction unit.

9. The filter circuit as set forth in claim 6, wherein said filter circuit includes a plurality of said voltage-current converters, and the filter circuit further comprises at least one operational amplifier between any of said voltage-current converters in a configuration in which said voltage-current converters are in a cascade connection.

10. A gain control method of a voltage-current converter, comprising steps of:
- converting voltage that is applied as input to a voltage-current converter to current; and
- intermittently extracting said converted current to control gain of said voltage-current converter by:
  - providing a first switching element connected between a voltage-current converter output terminal and an output terminal of a voltage-current conversion unit;
  - providing a second switching element connected between a fixed potential and the output terminal of said voltage-current conversion unit and that switches at a timing that is the reverse of said first switching element;
  - controlling switching of said first switching element; and
  - controlling the gain of the voltage-current converter by controlling a switching ratio of said first switching element when intermittently extracting current from the output terminal of said voltage-current conversion unit.

11. A voltage-current converter for converting voltage that is received as input to current and supplying the result, said voltage-current converter comprising:
- a converter input terminal;
- a converter output terminal;
- a voltage-current conversion unit for converting voltage that is applied as input to said converter input terminal to current;
- a first switching element that is connected between said converter output terminal and an output terminal of said voltage-current conversion unit; and
- a switch control unit for controlling switching of said first switching element;
- wherein said switch control unit provides said voltage-current conversion with the power-supply voltage at the same timing as said first switching element; and
- wherein an intermittent operation ratio when intermittently extracting current from the output terminal of said voltage-current conversion unit is controlled by a switching ratio of said first switching element.

12. A voltage-current converter for converting voltage that is received as input to current and supplying the result, said voltage-current converter comprising:
- a converter input terminal;
- a converter output terminal;
- a voltage-current conversion unit for converting voltage that is applied as input to said converter input terminal to current;
- a switching element X that is connected between a power supply and a power-supply terminal of said voltage-current conversion unit;
- a switching element Y that is connected between GROUND and a GROUND terminal of said voltage-current conversion unit; and
- a switch control unit for driving said switching elements X and Y at the same timing;
- wherein an intermittent operation ratio when intermittently extracting current from the output terminal of said voltage-current conversion unit is controlled by a switching ratio of said switching elements X and Y.

* * * * *